(12) United States Patent
Wu et al.

(10) Patent No.: US 12,376,406 B2
(45) Date of Patent: Jul. 29, 2025

(54) IMAGE SENSOR HAVING A REFLECTIVE LAYER OVERLAPPING WITH IMAGE SENSING ELEMENT

(71) Applicant: Powerchip Semiconductor Manufacturing Corporation, Hsinchu (TW)

(72) Inventors: Chien-Lung Wu, Hsinchu (TW); Wen-Hao Huang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 836 days.

(21) Appl. No.: 17/672,699

(22) Filed: Feb. 16, 2022

(65) Prior Publication Data
US 2023/0215891 A1 Jul. 6, 2023

(30) Foreign Application Priority Data

Jan. 4, 2022 (TW) .................................. 111100290

(51) Int. Cl.
*H10F 39/18* (2025.01)
*H10F 39/00* (2025.01)
*H10F 39/12* (2025.01)

(52) U.S. Cl.
CPC ......... *H10F 39/807* (2025.01); *H10F 39/014* (2025.01); *H10F 39/024* (2025.01);
(Continued)

(58) Field of Classification Search
CPC ......... H10F 39/18–1898; H10F 39/199; H10F 39/014; H10F 39/8067; H10F 39/811
See application file for complete search history.

(56) References Cited

U.S. PATENT DOCUMENTS

| 7,982,177 B2 | 7/2011 | Nozaki et al. |
| 8,759,742 B2 | 6/2014 | Yokogawa |

(Continued)

FOREIGN PATENT DOCUMENTS

| CN | 113383431 | 9/2021 |
| CN | 113811999 | 12/2021 |

(Continued)

OTHER PUBLICATIONS

"Office Action of Taiwan Counterpart Application", issued on Aug. 5, 2022, p. 1-p. 7.

*Primary Examiner* — Kevin Parendo
(74) *Attorney, Agent, or Firm* — JCIPRNET

(57) ABSTRACT

The disclosure provides an image sensor integrated chip and a method for forming the same. The image sensor integrated chip includes a substrate including a pixel region, an isolation structure disposed in the substrate and configured at opposite sides of the pixel region, an image sensing element disposed in the pixel region of the substrate, a gate structure disposed on the pixel region of the substrate, a first dielectric layer disposed above the pixel region of the substrate and covering sidewalls and a portion of a top surface of the gate structure, and a reflective layer disposed on the first dielectric layer. The reflective layer overlaps with the image sensing element and the portion of the top surface of the gate structure in a first direction perpendicular to a surface of the substrate.

6 Claims, 5 Drawing Sheets

(52) U.S. Cl.
CPC .......... *H10F 39/18* (2025.01); *H10F 39/199* (2025.01); *H10F 39/8037* (2025.01); *H10F 39/805* (2025.01); *H10F 39/8067* (2025.01); *H10F 39/811* (2025.01); *H10F 39/8053* (2025.01); *H10F 39/8057* (2025.01); *H10F 39/8063* (2025.01)

(56) References Cited

U.S. PATENT DOCUMENTS

| | | | | |
|---|---|---|---|---|
| 2018/0315789 | A1* | 11/2018 | Takahashi | H10F 39/8067 |
| 2019/0043911 | A1* | 2/2019 | Honda | H01L 21/7682 |
| 2019/0057994 | A1* | 2/2019 | Huang | H10F 39/014 |
| 2020/0027909 | A1* | 1/2020 | Ebiko | H10F 39/807 |
| 2022/0246666 | A1* | 8/2022 | Kunitake | H10F 39/8027 |
| 2022/0406827 | A1* | 12/2022 | Komuro | G01S 7/4863 |
| 2023/0326944 | A1* | 10/2023 | Morimoto | G02B 5/28 |
| | | | | 257/432 |

FOREIGN PATENT DOCUMENTS

| | | |
|---|---|---|
| TW | 202034536 | 9/2020 |
| TW | 202147594 | 12/2021 |
| WO | 2021215337 | 10/2021 |

\* cited by examiner

IMAGE SENSOR HAVING A REFLECTIVE LAYER OVERLAPPING WITH IMAGE SENSING ELEMENT

CROSS-REFERENCE TO RELATED APPLICATION

This application claims the priority benefit of Taiwan application serial no. 111100290, filed on Jan. 4, 2022. The entirety of the above-mentioned patent application is hereby incorporated by reference herein and made a part of this specification.

BACKGROUND OF THE INVENTION

1. Field of the Invention

The invention relates to a semiconductor structure and a method for forming the same, and more particularly, to an image sensor integrated chip and a method for forming the same.

2. Description of Related Art

Image sensor integrated circuits (IC) are widely used in devices such as cameras and cell phones. In recent years, complementary metal-oxide semiconductor (CMOS) image sensors are increasingly favored due to low power consumption, a small size, fast data processing, a direct output of data, and low manufacturing cost as compared to charge-coupled device (CCD) image sensors. Some types of CMOS image sensors include front-side illuminated (FSI) image sensors and back-side illuminated (BSI) image sensors. Therefore, the CMOS image sensors have begun to largely replace the CCD image sensors. In general, CMOS image sensors may include front-side illuminated (FSI) image sensors and back-side illuminated (BSI) image sensors.

However, as device sizes continue to shrink, those skilled in the art continue to improve the cross-talk between neighboring pixel regions in the CMOS image sensors and the quantum efficiency (QE) of the CMOS image sensors.

SUMMARY OF THE INVENTION

The present invention provides an image sensor integrated chip and a method for forming the same, in which a reflective layer is configured to overlap with an image sensing element and a portion of a top surface of a gate structure in a direction perpendicular to a surface of a substrate, such that incident radiations (e.g., an incident light) passing through the image sensing element and/or incident radiations that merely pass through a pixel region without passing through the image sensing element can be reflected to the image sensing element by the reflective layer. As a result, the quantum efficiency of the image sensor integrated chip can be further increased by the reflected radiations. Besides, some of the incident radiations, such as incident radiations with large incidence angles, that may pass through the gate structure and being reflected to the neighboring pixel region by wiring layers/structures formed in a back-end of the line (BEoL) process can be reduced since the reflective layer overlaps with the portion of the top surface of the gate structure and thereby improving the cross-talk between neighboring pixel regions.

An embodiment of the present invention provides an image sensor integrated chip including a substrate, an isolation structure, an image sensing element, a gate structure, a first dielectric layer, and a reflective layer. The substrate includes a pixel region. The isolation structure is disposed in the substrate and is configured at opposite sides of the pixel region. The image sensing element is disposed in the pixel region of the substrate. The gate structure is disposed on the pixel region of the substrate. The first dielectric layer is disposed over the pixel region of the substrate and covers sidewalls and a portion of a top surface of the gate structure. The reflective layer is disposed on the first dielectric layer. The reflective layer overlaps with the image sensing element and the portion of the top surface of the gate structure in a first direction perpendicular to a surface of the substrate.

In some embodiments, the image sensor integrated chip further includes a reflective pattern disposed in the first dielectric layer and directly in contact with the reflective layer, wherein the reflective pattern overlaps with the image sensing element in the first direction.

In some embodiments, the reflective pattern includes dummy vias that are electrically floating.

In some embodiments, the image sensor integrated chip further includes an etching stop layer disposed between the substrate and the first dielectric layer and between the gate structure and the first dielectric layer, wherein the dummy vias includes first ends in contact with the reflective layer and second ends in contact with the etching stop layer, and sizes of the first ends are greater than that of the second ends.

In some embodiments, the etching stop layer includes a first material layer and a second material layer stacked on the surface of the substrate in sequence, and a material of the first material layer is different from a material of the second material layer.

In some embodiments, the image sensor integrated chip further includes a second dielectric layer and a conductive contact. The second dielectric layer is disposed on the first dielectric layer and on the reflective layer. The conductive contact is disposed in the second dielectric layer and is in contact with the gate structure, wherein the conductive contact is electrically connected to the gate structure and is electrically isolated from the reflective layer.

In some embodiments, the conductive contact is spaced apart from the first dielectric layer and the reflective layer by the second dielectric layer.

In some embodiments, the second dielectric layer includes a portion disposed between the conductive contact and the reflective layer and between the conductive contact and the first dielectric layer in a second direction parallel to the surface of the substrate.

In some embodiments, the portion of the second dielectric layer is in contact with the gate structure.

An embodiment of the present invention provides a method of forming an image sensor integrated chip, which includes following steps. An isolation structure is formed in the substrate to define a pixel region in the substrate. An image sensing element formed within the pixel region of the substrate. A gate structure is formed above the pixel region of the substrate. A first dielectric layer covering sidewalls and a portion of a top surface of the gate structure is formed above the pixel region of the substrate. A reflective layer is formed on the first dielectric layer. A first opening penetrating the first dielectric layer and the reflective layer and exposing a first portion of the top surface of the gate structure is formed, wherein a second portion of the top surface of the gate structure that is different from the first portion overlaps with the first dielectric layer and the reflective layer in a first direction perpendicular to a surface of the substrate. A second dielectric layer is formed on the reflective layer, wherein the second dielectric layer fills into the first opening. A conductive contact is formed in the second dielectric layer, wherein the conductive contact penetrates a portion of the second dielectric layer in the first opening to contact the gate structure, and the conductive contact is electrically connected to the gate structure and is electrically isolated from the reflective layer.

In some embodiments, the method further includes forming second openings in the first dielectric layer above the image sensing element before forming the reflective layer. In a step of forming the reflective layer on the first dielectric layer, the reflective layer fills in the second openings to form a reflective pattern including dummy vias.

In some embodiments, the method further includes forming an etching stop layer covering the sidewalls and the top surface of the gate structure on the pixel region of the substrate before forming the first dielectric layer. In a step of forming the second openings, the second openings expose the etching stop layer.

In some embodiments, the etching stop layer includes a first material layer and a second material layer formed on the pixel region of the substrate in sequence, and a material of the first material layer is different from a material of the second material layer.

In some embodiments, the conductive contact is spaced apart from the first dielectric layer and the reflective layer by the second dielectric layer.

In some embodiments, the second dielectric layer includes a portion disposed between the conductive contact and the reflective layer and between the conductive contact and the first dielectric layer in a second direction parallel to the surface of the substrate.

In some embodiments, the portion of the second dielectric layer is in contact with the gate structure.

Based on the above, in the above image sensor integrated chip and the method for forming the same, since the reflective layer is configured to overlap with the image sensing element and the portion of the top surface of the gate structure in the direction perpendicular to the surface of the substrate, incident radiations passing through the image sensing element and/or incident radiations that merely pass through a pixel region without passing through the image sensing element can be reflected to the image sensing element by the reflective layer. As a result, the quantum efficiency of the image sensor integrated chip can be further increased by the reflected radiations. Besides, since the reflective layer overlaps with the portion of the top surface of the gate structure, some of the incident radiations, such as incident radiations with large incidence angles, that may pass through the gate structure and being reflected to the neighboring pixel region by wiring layers/structures formed in a BEoL process can be reduced and thereby improving the cross-talk between neighboring pixel regions.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
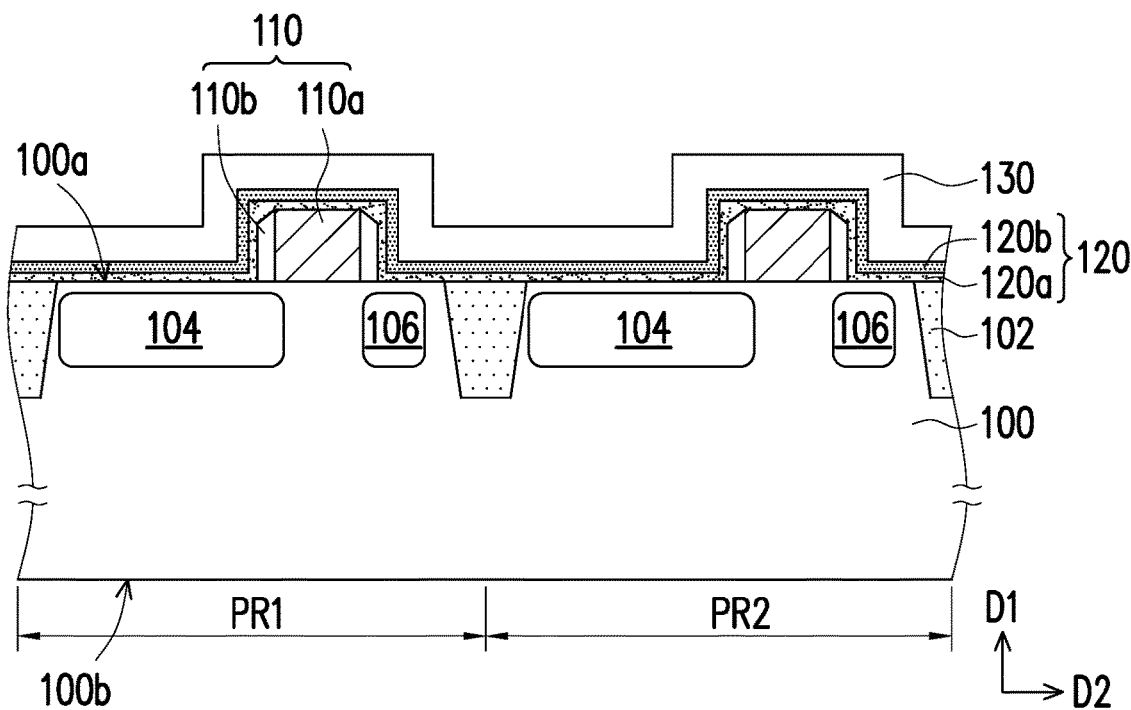
FIGS. 1-5 is schematic cross-section views illustrating a method of forming an image sensor integrated chip in accordance with an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements. As used herein, "electrical connection" may refer to the concept including a physical connection (e.g., wired connection) and a physical disconnection (e.g., wireless connection).

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

Figure 6:
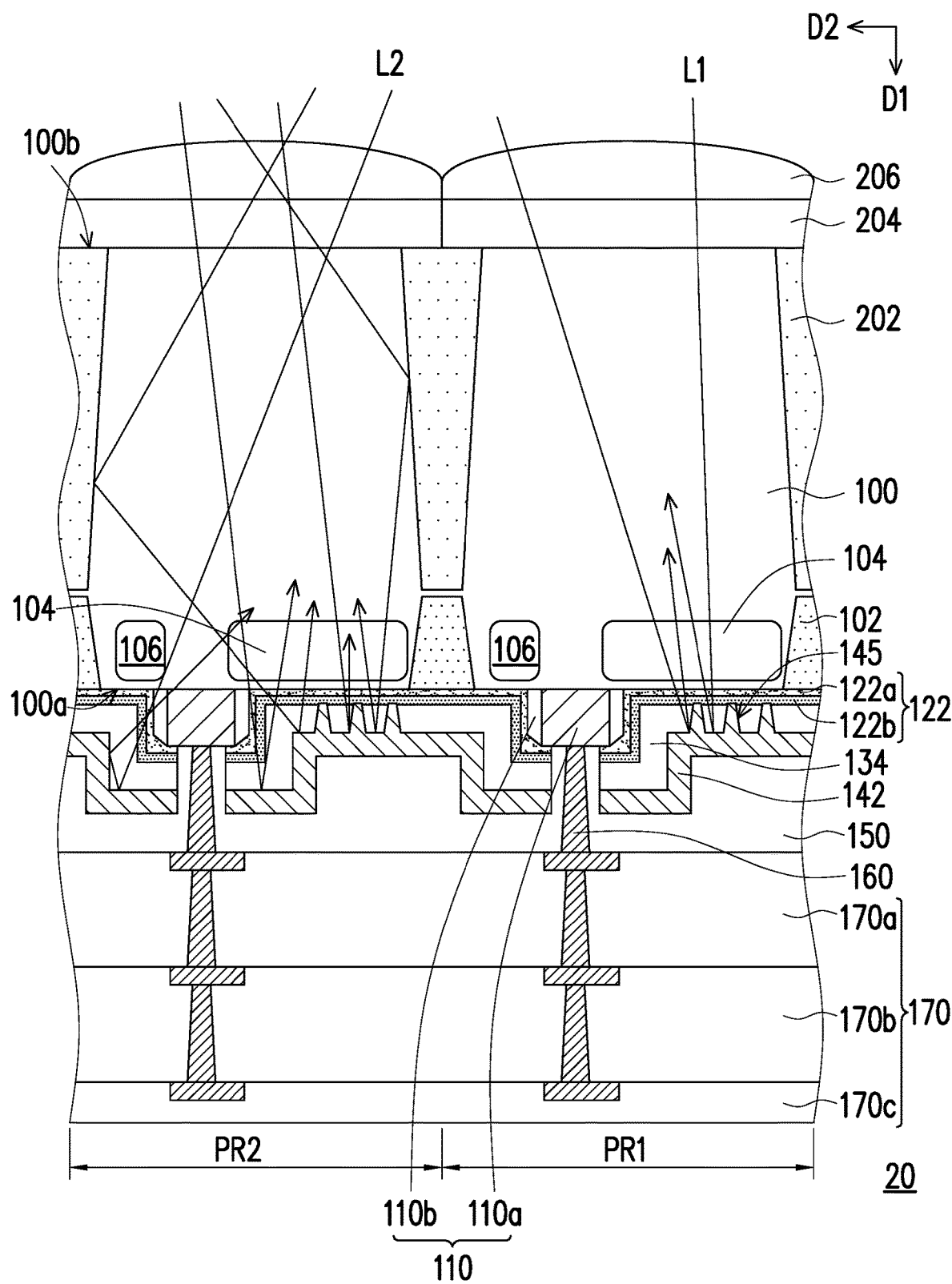
FIG. 6 is a schematic cross section illustrating an image sensor integrated chip in accordance with an embodiment of the present invention.
Figure 7A:
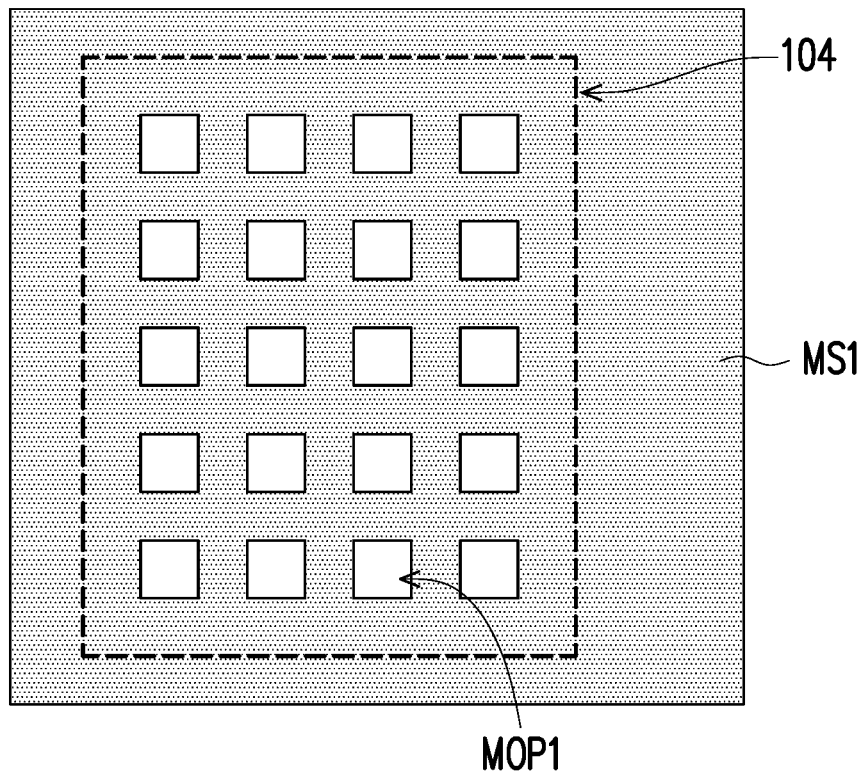
FIG. 7A is a schematic top view illustrating a mask for forming a photoresist pattern in accordance with an embodiment of the present invention.
Figure 7B:
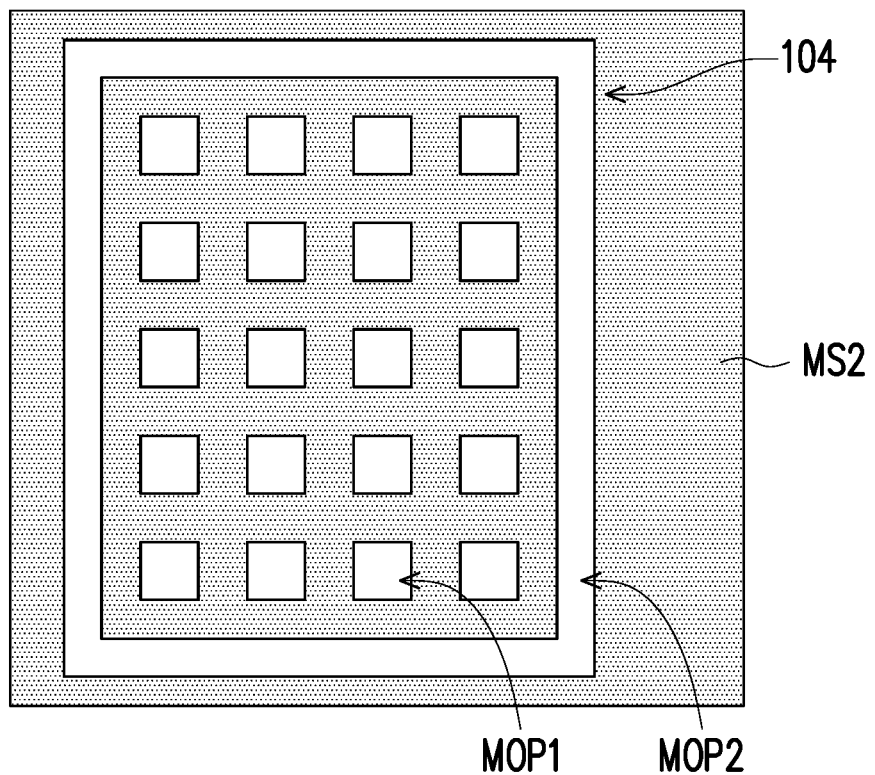
FIG. 7B is a schematic top view illustrating a mask for forming a photoresist pattern in accordance with another embodiment of the present invention.

FIGS. 1-5 is schematic cross-section views illustrating a method of forming an image sensor integrated chip in accordance with an embodiment of the present invention. FIG. 6 is a schematic cross section illustrating an image sensor integrated chip in accordance with an embodiment of the present invention. FIG. 7A is a schematic top view illustrating a mask for forming a photoresist pattern in accordance with an embodiment of the present invention. FIG. 7B is a schematic top view illustrating a mask for forming a photoresist pattern in accordance with another embodiment of the present invention.

Firstly, with reference to FIG. 1, an isolation structure 102 is formed in a substrate 100 to define pixel regions PR1 and PR2 in the substrate 100. The substrate 100 may include a first surface 100a (e.g., a front surface) and a second surface 100b (e.g., a rear surface). The isolation structure 102 may extend into the substrate 100 from the first surface 100a of the substrate 100. The isolation structure 102 may be disposed in the substrate 100 and configured at opposite sides of the pixel regions PR1 and PR2.

The substrate 100 may be any type of semiconductor body (e.g., silicon, SiGe, SOI, etc.), as well as any other type of semiconductor and/or epitaxial layers, associated therewith. The isolation structure 102 may include one or more of dielectric materials. The dielectric materials may include an oxide (e.g., silicon oxide), TEOS (tetraethyl orthosilicate), a nitride (e.g., silicon nitride, silicon oxynitride, etc.), a carbide (e.g., silicon carbide, silicon oxycarbide, etc.), or the like.

Next, image sensing elements 104 are formed within the pixel regions PR1 and PR2 of the substrate 100. The image sensing elements 104 may be formed in the pixel regions PR1 and PR2 of the substrate 100 at positions adjacent to the first surface 100a of the substrate 100. In some embodiments, when the image sensor integrated chip is applied to the BSI image sensor, the image sensing elements 104 may receive radiations (such as light) emitting from the second surface 100b of the substrate 100 toward the first surface 100a of the substrate 100 and then transfer into electrical signals.

Then, gate structures 110 are formed on the pixel regions PR1 and PR2 of the substrate 100. The gate structures 110 may be gate structures in a transfer transistor, a source-follower transistor, a row select transistor, and/or a reset transistor, the invention is not limited thereto. The gate structures 110 may include gates 110a and gate spacers 110b. In some embodiments, the gate structures 110 may be the gate structures of the transfer transistors, and the gates 110a may be transfer gates. The transfer gates 110a may be configured to selectively control the movement of charge carriers between the image sensing elements 104 and floating diffusion wells 106 configured in doped regions arranged within the substrate 100. In some embodiments, the image sensing elements 104 and the floating diffusion wells 106 may be configured at opposite sides of the gate structures 110. The gates 110a may include any materials that can be used as gates, such as polysilicon. The gate spaces 110b may include any materials that can be used as gate spacers, such as silicon nitride.

Next, an etching stop layer 120 is formed on the first surface 100a of the substrate 100. The etching stop layer 120 may be also referred to a contact etching stop layer (CESL). The etching stop layer 120 covers the pixel regions PR1 and PR2 of the substrate 100 and sidewalls and top surfaces of the gate structures 110. In some embodiments, the etching stop layer 120 may include a first material layer 120a and a second material layer 120b formed on the first surface 100a of the substrate 100 in sequence. A material of the first material layer 120a is different from that of the second material layer 120b. For example, the material of the first material layer 120a may be an oxide such as a silicon oxide, and the material of the second material layer 120b may be a nitride such as a silicon nitride.

Then, a first dielectric layer 130 is formed on the etching stop layer 120. The first dielectric layer 130 may be conformally formed on the etching stop layer 120. That is, the first dielectric layer 130 may cover above the pixel regions PR1 and PR2 and above the sidewalls and the top surfaces of the gate structures 110. The material of the first dielectric layer 130 may include a borophosphosilicate glass (BPSG), a phosphorus doped TEOS (PTEOS), or a silicon oxide formed by a high density plasma (HDP). The thickness of the first dielectric layer 130 is about 500 Å to 4000 Å.

Figure 2:
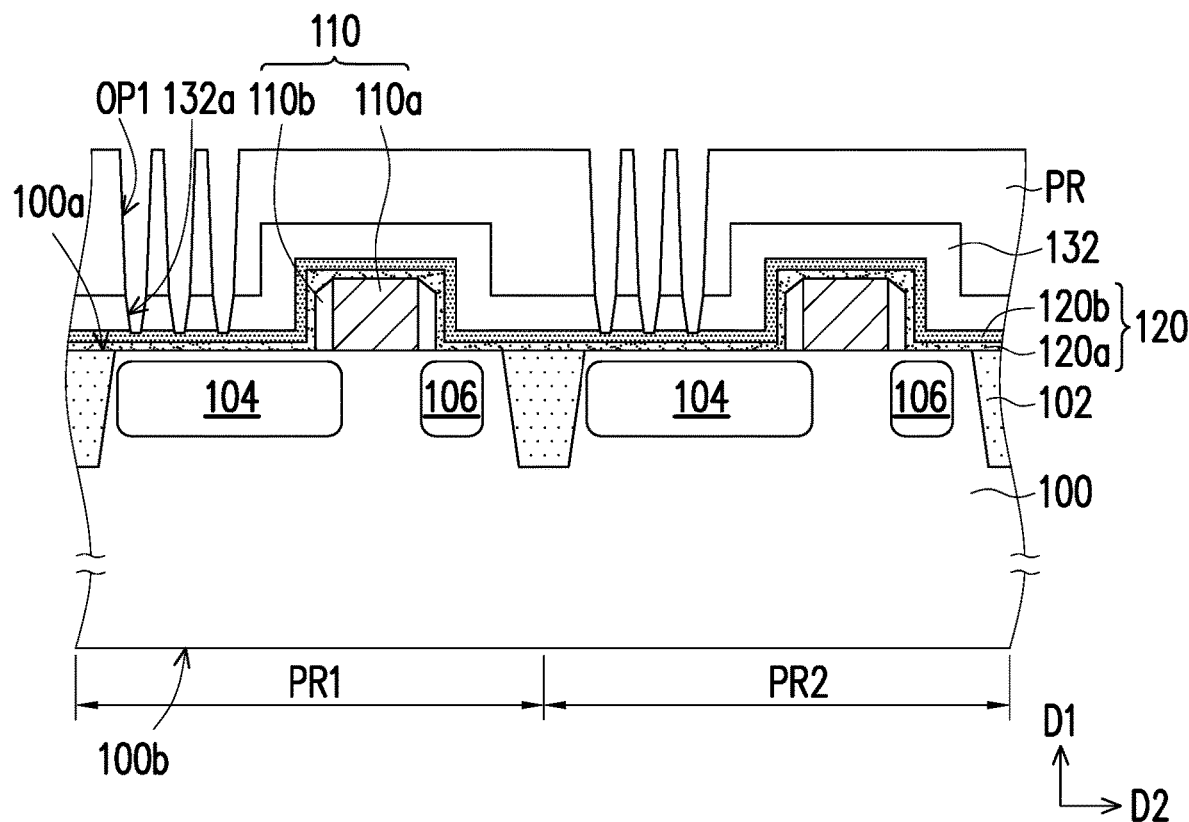

After that, with reference to FIGS. 1 and 2, a photoresist pattern PR is formed on the first dielectric layer 130. In some embodiments, the photoresist pattern PR may be formed through following steps. Firstly, a photoresist material layer (not illustrated) is formed on the first dielectric layer 130. Then, a patterning process (e.g., photolithography process) is performed on the photoresist material layer by a mask (e.g., a mask MS1 shown in FIG. 7A) to form the photoresist pattern PR including openings OP1. For example, the mask MS1 shown in FIG. 7A includes opening patterns MOP1 configured over the image sensing elements 104, wherein the locations of the opening patterns MOP1 are corresponding to the locations of the openings OP1 subsequentially formed in the photoresist pattern PR, such that the above photoresist pattern PR may be formed by performing the photolithography process on the photoresist material layer through the mask MS1. The openings OP1 of the photoresist pattern PR expose the first dielectric layer 130. The sizes of the opening patterns MOP1 of the mask MS1 are about 0.1 μm to about 0.5 μm. The pitches of the opening patterns MOP1 of the mask MS1 are about 0.2 μm to about 1 μm. The shapes of the opening patterns MOP1 shown in FIG. 7A are rectangle, but the invention is not limited thereto. In other embodiments, the opening patterns MOP1 may be in shapes such as squares, circles, rectangles, diamonds, or polygons. In some other embodiments, the photoresist pattern PR may also be formed by a mask MS2 shown in FIG. 7B. The main difference between the mask MS2 shown in FIG. 7B and the mask MS1 shown in FIG. 7A is that the mask MS2 shown in FIG. 7B further includes a ring shape opening pattern MOP2 for forming a light shielding ring. The location of the ring shape opening pattern MOP2 may be corresponding to boundaries of the image sensing elements 104 in a direction perpendicular to the first surface 100a of the substrate 100. The sizes of the opening patterns MOP1 of the mask MS2 are about 0.1 μm to about 0.5 μm. The pitches of the opening patterns MOP1 of the mask MS2 are about 0.2 μm to about 1 μm. The size of the ring shape opening pattern MOP2 is about 0.1 μm to about 1 μm.

Then, a patterning process is performed on the first dielectric layer 130 by using the photoresist pattern PR as a mask to form openings 132a in the first dielectric layer 132. In some embodiments, the openings 132a may be formed in the first dielectric layer 132 without exposing a top surface of the etching stop layer 120. That is, bottom surfaces of the openings 132a may be higher than the top surface of the etching stop layer 120. In some other embodiments, the openings 132a may penetrate through the first dielectric layer 132 and stop on the top surface of the etching stop layer 120. That is, the bottom surfaces of the openings 132a may be coplanar with the top surface of the etching stop layer 120. In some alternative embodiments, the openings 132a may remove portions of the etching stop layer 120 resulting from an over etch. That is, the bottom surfaces of the openings 132a may be lower than the top surface of the etching stop layer 120. The etching stop layer 120 may avoid a damage to the first surface 100a of the substrate 100 during the process of forming the openings 132a, thereby preventing issues such as a white pixel and/or a dark current.

Figure 3:
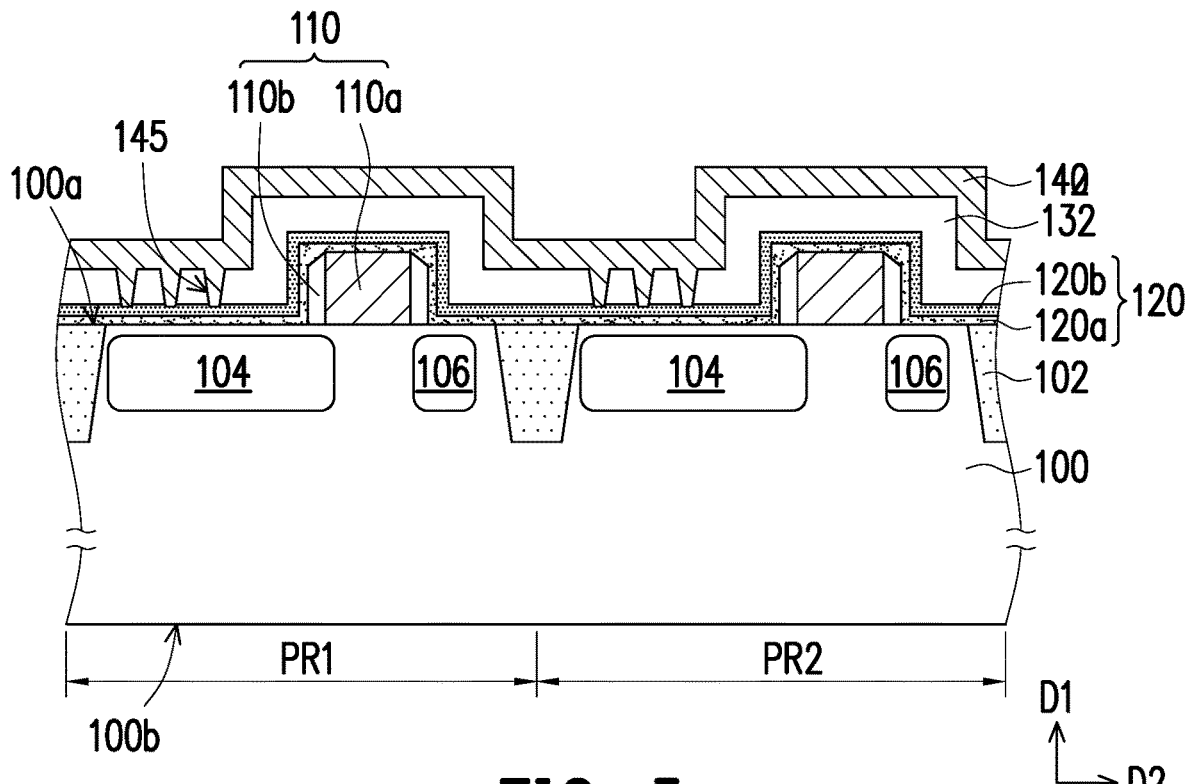

After that, with reference to FIGS. 2 and 3, the photoresist pattern PR is removed and then a reflective layer 140 is formed on the first dielectric layer 132. In some embodiments, the reflective layer 140 may fill in the openings 132a of the first dielectric layer 132 so as to form reflective patterns 145. The reflective patterns 145 overlap with the image sensing elements 104 in a first direction D1 perpendicular to the first surface 100a of the substrate 100, such that the incident radiations (e.g., incident light) that has been passed through the image sensing elements 104 can be reflected to the image sensing elements 104 again, and thereby improving the quantum efficiency of the image sensor integrated chip. In some embodiments, as shown in FIG. 3, the reflective patterns 145 may fill up the openings 132a of the first dielectric layer 132, but the invention is not limited thereto. In some other embodiments, the reflective patterns 145 may be also formed on sidewalls and bottom surfaces of the openings 132a of the first dielectric layer 132 without filling up the openings 132a. In some embodiments, the reflective layer 140 and the reflective patterns 145 may be formed in the same process simultaneously. That is, interfaces where different materials/film layers/structures are in contact with each other are not presented between the reflective layer 140 and the reflective patterns 145, but the invention is not limited thereto. The material of the reflective layer 140 may include metals such as Al, Cu, Ti, W, Co, Ni, or Ta or metal nitrides such as TiN. The thickness of the reflective layer 140 may be about 500 Å to about 4000 Å.

Figure 4:
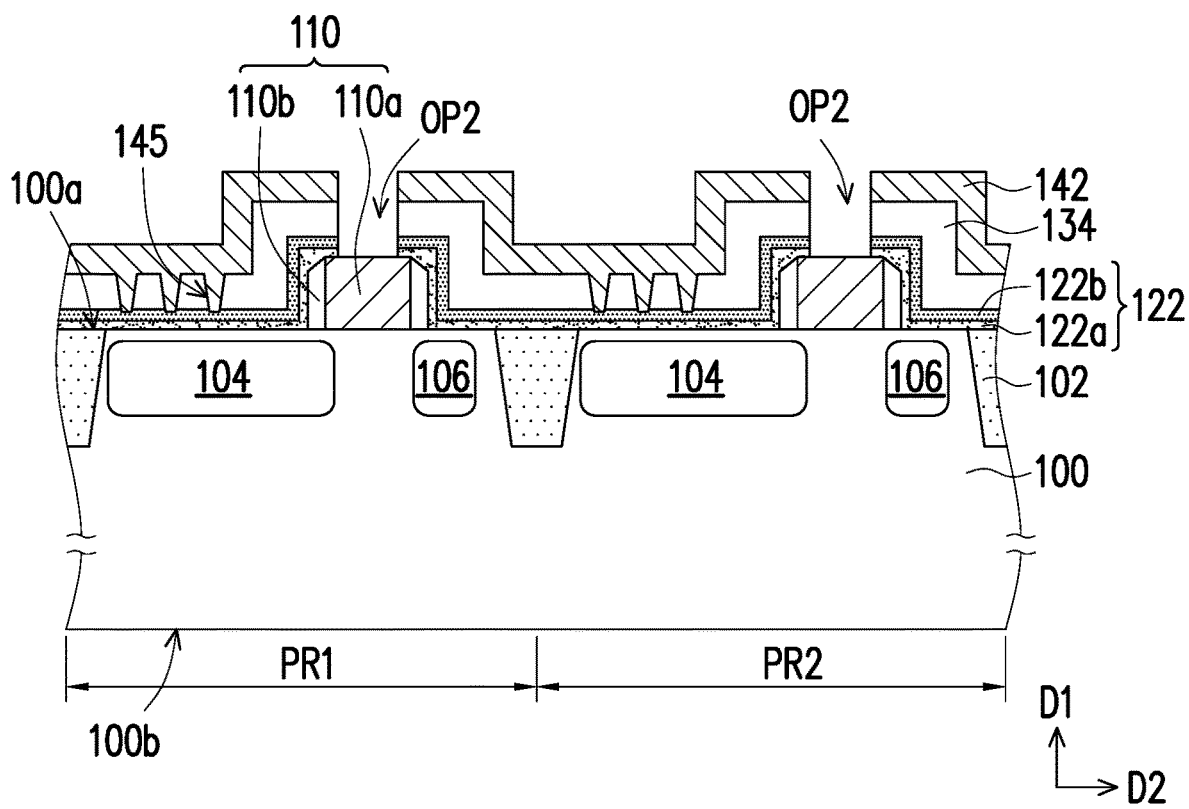

Then, with reference to FIGS. 3 and 4, openings OP2 that penetrate the reflective layer 140, the first dielectric layer 132, and the etching stop layer 120 are formed to expose portions (e.g., a first portions) of the top surfaces of the gate structures 110 (e.g., the top surfaces of the gates 110a being exposed by the openings OP2), wherein other portions (e.g., second portions being different from the first portions) of the top surfaces of the gate structures 110 overlap with the etching stop layer 122 including first and second material layers 122a and 122b, the first dielectric layer 134, and the reflective layer 142 in the first direction D1 perpendicular to the first surface 100a of the substrate 100. For example, the top surfaces of the gate spacers 110b overlap with the etching stop layer 122, the first dielectric layer 134, and the reflective layer 142 in the first direction D1. That is, the reflective layer 142 overlaps with the image sensing elements 104 and the portions (e.g., the second portions) of the gate structures 110 in the first direction D1 perpendicular to the first surface 100a of the substrate 100. As such, incident radiations passing through the image sensing elements 104 and/or incident radiations that merely pass through pixel regions PR1 and PR2 without passing through the image sensing elements 104 can be reflected to the image sensing elements 104 by the reflective layer 142, and thereby the quantum efficiency of the image sensor integrated chip can be further increased. For example, since the reflective layer 142 overlaps with the image sensing elements 104 and the portions of the top surfaces of the gate structures 110 in the first direction D1, incident radiations that may pass through the gate structures and being reflected to the neighboring pixel regions by the wiring layers/structures formed in the BEoL process (e.g., vias 180 and wiring layers 182 formed in a dielectric structure 170) can be reduced, and thereby improving the cross-talk between neighboring pixel regions. Besides, the incident radiations such as incident radiations with large incidence angles that merely pass through the pixel regions PR1 and PR2 without passing through the image sensing elements 104 can be reflected to the image sensing elements 104 by the reflective layer 142, such that the quantum efficiency of the image sensor integrated chip can be further increased.

Figure 5:
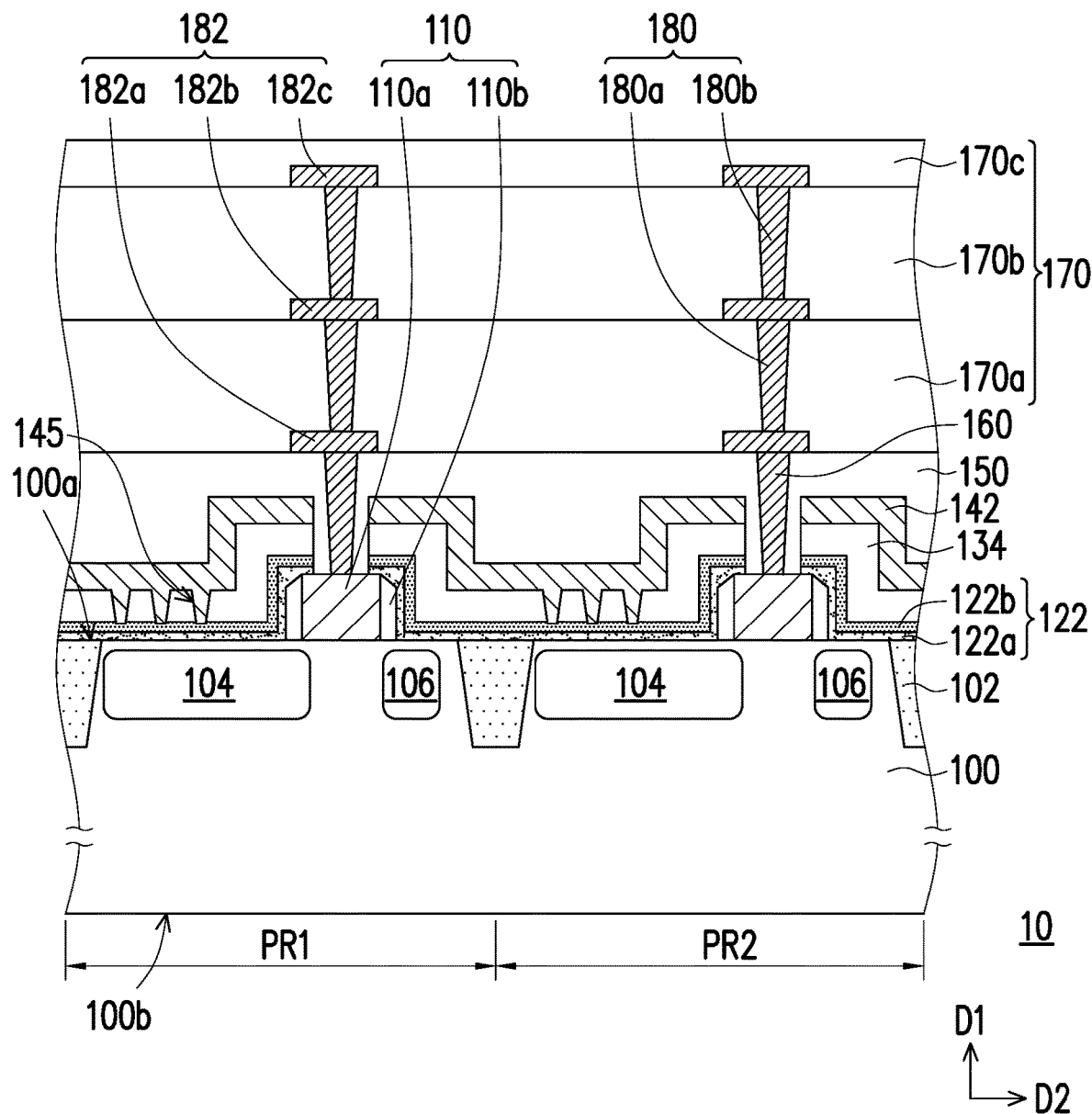

Next, with reference to FIGS. 4 and 5, a second dielectric layer 150 is formed on the reflective layer 142, wherein the second dielectric layer 150 fills in the openings OP2. The second dielectric layer 150 may include one or more of silicon dioxide, SiCOH, a fluorosilicate glass, a phosphate glass (e.g., borophosphate silicate glass), or the like.

Then, conductive contacts 160 are formed in the second dielectric layer 150, wherein the conductive contacts 160 penetrate portions of the second dielectric layer 150 in the openings OP2 to contact the gate structures 110, and the conductive contacts 160 are electrically connected to the gate structures 110 and are electrically isolated from the reflective layer 142. The reflective layer 142 and the reflective patterns 145 between the first dielectric layer 134 and the second dielectric layer 150 are used as a layer and patterns to reflect the incident radiations and do not electrically connect to the conductive contacts 160 and vias 180 and wiring layers 182 electrically connected to the conductive contacts 160, so the reflective layer 142 may be regarded as a dummy layer (e.g., a dummy conductive layer/a dummy metal layer), and the reflective patterns 145 in contact with the reflective layer 142 may also be regarded as dummy patterns (e,g., dummy vias). For example, the reflective patterns 145 shown in FIG. 4 may include the reflective patterns 145 including dummy vias. In some embodiments, the reflective layer 142 and/or the reflective patterns 145 may be electrically floating. In some embodiments, the dummy vias of the reflective patterns 145 may include first ends in contact with the reflective layer 142 and second ends in contact with the etching stop layer 122, wherein the sizes of the dummy vias at the first ends are larger than the sizes of the dummy vias at the second ends.

In some embodiments, the conductive contacts 160 may be spaced apart from the first dielectric layer 134 and the reflective layer 142 by the second dielectric layer 150. That is, the second dielectric layer 150 may include portions disposed between the conductive contacts 160 and the reflective layer 142 and between the conductive contacts 160 and the first dielectric layer 134 in a second direction D2 parallel to the first surface 100a of the substrate 100. In some embodiments, the conductive contacts 160 may be spaced apart from the etching stop layer 122 by the second dielectric layer 150. That is, the second dielectric layer 150 may include portions disposed between the conductive contacts 160 and the reflective layer 142, between the conductive contacts 160 and the first dielectric layer 134, and between the conductive contacts 160 and the etching stop layer 122 in the second direction D2 parallel to the first surface 100a of the substrate 100. In the foregoing embodiments, the portions of the second dielectric layer 150 are in contact with the gate structures 110. For example, the portions of the second dielectric layer 150 are in contact with the first portions of the top surfaces of the gate structures 110.

Next, referring to FIG. 5, a dielectric structure 170 and vias 180 and wiring layers 182 formed in the dielectric structure 170 are formed on the second dielectric layer 150 to form an image sensor integrated chip 10. In some embodiments, the dielectric structure 170 may include dielectric layers 170a, 170b, and 170c formed on the second dielectric layer 150 in sequence. In some embodiments, vias 180 may include vias 180a formed in the dielectric layer 170a and vias 180b formed in the dielectric layer 170b. In some embodiments, the wiring layers 182 may include wiring layers 182a formed in the dielectric layer 170a and located between the conductive contacts 160 and the vias 180a, wiring layers 182b formed in the dielectric layer 170b and located between the vias 180a and vias 180b, and wiring layers 182c formed in the dielectric layer 170c and located on the vias 180b. The dielectric layers 170a, 170b, and 170c may include one or more of silicon dioxide, SiCOH, a fluorosilicate glass, a phosphate glass (e.g., borophosphate silicate glass), or the like. The vias 180 and/or the wiring layers 182 may include copper, tungsten, ruthenium, aluminum, and/or the like.

After that, with reference to FIGS. 5 and 6, an isolation structure 202 is formed in the substrate 100, wherein the isolation structure 202 extends into the substrate 100 from the second surface 100b of the substrate 100. In some embodiments, the isolation structure 202 may be spaced apart from the isolation structure 102. In some other embodiments, the isolation structure 202 may be in contact with the isolation structure 102. The isolation structure 202 may include one or more of dielectric materials. The dielectric materials may include an oxide (e.g., silicon oxide), TEOS (tetraethyl orthosilicate), a nitride (e.g., silicon nitride, silicon oxynitride, etc.), a carbide (e.g., silicon carbide, silicon oxycarbide, etc.), or the like.

Then, referring to FIG. 6, color filters 204 are formed on the second surface 100b of the substrate 100. The color filters 204 may be formed over the pixel regions PR1 and PR2, respectively. Interfaces where the color filters 204 are in contact with each other may be located on the isolation structure 202. The color filters 204 are made of materials that allow the radiations (e.g., light) with specific wavelengths passing through while blocking radiations with wavelengths other than the specific wavelengths. In some embodiments, the color filters 204 may be formed by a monomer, a polymer, or the like.

Next, micro-lenses 206 are formed on the color filters 204 to form an image sensor 20. In some embodiments, the micro-lenses 206 may be formed by depositing a micro-lens material above the color filters 204 (e.g., by a spin-on method or a deposition process). A micro-lens template (not shown) having a curved upper surface is patterned above the micro-lens material. The micro-lens template may include a photoresist material exposed using a distributing exposing light dose (e.g., for a negative photoresist, more light is exposed at a bottom of the curvature and less light is exposed at a top of the curvature), developed, and baked to form a rounding shape. The micro-lenses 206 are then formed by selectively etching the micro-lens material according to the micro-lens template.

With reference to incident radiations L1 and L2 shown in FIG. 6, since the reflective layer 142 is configured to overlap with the image sensing elements 104 and the portions of the top surfaces of the gate structures 110 in the direction perpendicular to the surface (e.g., first surface 100a and/or second surface 100b) of the substrate 100, the incident radiations L1 and L2 passing through the image sensing elements 104 and/or the incident radiations that merely pass through the pixel regions PR1 and PR2 without passing through the image sensing elements 104 can be reflected to the image sensing elements 104 by the reflective layer 142. As such, the quantum efficiency of the image sensor 20 can be further increased by the reflected radiations. Besides, since the reflective layer 142 is designed to overlaps with the portion of the top surfaces of the gate structures 110, some of the incident radiations, such as incident radiations with large incidence angles, that may pass through the gate structures and being reflected to the neighboring pixel regions by wiring layers/structures formed in the BEoL process can be reduced and thereby improving the cross-talk between neighboring pixel regions (e.g., pixel regions PR1 and PR2). In other aspects, since the reflective patterns 145 are disposed below the image sensing elements 104, it may help the incident radiations L1 and L2 which have been passed through the image sensing elements 104 to reflect to the image sensing elements 104 again. In some embodiments, when the reflective patterns 145 are the reflective patterns including dummy vias, the the reflective patterns 145 may help to avoid the reflective radiations reflecting to the neighboring pixel regions.

In light of the above, in the foregoing image sensor integrated chip and the method for forming the same of the embodiments, since the reflective layer is configured to overlap with the image sensing element and the portion of the top surface of the gate structure in the direction perpendicular to the surface of the substrate, incident radiations passing through the image sensing element and/or incident radiations that merely pass through a pixel region without passing through the image sensing element can be reflected to the image sensing element by the reflective layer. As a result, the quantum efficiency of the image sensor integrated chip can be further increased by the reflected radiations. Besides, since the reflective layer overlaps with the portion of the top surface of the gate structure, some of the incident radiations, such as incident radiations with large incidence angles, that may pass through the gate structure and being reflected to the neighboring pixel region by wiring layers/structures formed in the BEoL process can be reduced and thereby improving the cross-talk between neighboring pixel regions.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An image sensor integrated chip, comprising:
   a substrate comprising a pixel region;
   an isolation structure disposed in the substrate and configured at opposing sides of the pixel region;
   an image sensing element disposed in the pixel region of the substrate;
   a gate structure disposed on the pixel region of the substrate;
   a first dielectric layer disposed above the pixel region of the substrate and covering sidewalls and a portion of a top surface of the gate structure;
   a reflective layer disposed on the first dielectric layer, wherein the reflective layer overlaps with the image sensing element and the portion of the top surface of the gate structure in a first direction perpendicular to a surface of the substrate;
   a reflective pattern disposed in the first dielectric layer and directly in contact with the reflective layer, wherein the reflective pattern overlaps with the image sensing element in the first direction, wherein the reflective pattern comprises dummy vias that are electrically floating; and
   an etching stop layer disposed between the substrate and the first dielectric layer and between the gate structure and the first dielectric layer, wherein the dummy vias comprise first ends in contact with the reflective layer and second ends in contact with the etching stop layer, and sizes of the first ends are greater than that of the second ends.

2. The image sensor integrated chip of claim 1, wherein the etching stop layer comprises a first material layer and a second material layer stacked on the surface of the substrate in sequence, and a material of the first material layer is different from a material of the second material layer.

3. The image sensor integrated chip of claim 1, further comprising:
   a second dielectric layer disposed on the first dielectric layer and the on the reflective layer; and
   a conductive contact disposed in the second dielectric layer and in contact with the gate structure, wherein the conductive contact is electrically connected to the gate structure and is electrically isolated from the reflective layer.

4. The image sensor integrated chip of claim 3, wherein the conductive contact is spaced apart from the first dielectric layer and the reflective layer by the second dielectric layer.

5. The image sensor integrated chip of claim 3, wherein the second dielectric layer comprises a portion disposed between the conductive contact and the reflective layer and between the conductive contact and the first dielectric layer in a second direction parallel to the surface of the substrate.

6. The image sensor integrated chip of claim 5, wherein the portion of the second dielectric layer is in contact with the gate structure.

* * * * *